US008432727B2

(12) United States Patent
Ryu et al.

(10) Patent No.: US 8,432,727 B2
(45) Date of Patent: Apr. 30, 2013

(54) INVALID WRITE PREVENTION FOR STT-MRAM ARRAY

(75) Inventors: Kyungho Ryu, Seoul (KR); Jisu Kim, Seoul (KR); Seong-Ook Jung, Seoul (KR); Seung H. Kang, San Diego, CA (US)

(73) Assignees: QUALCOMM Incorporated, San Diego, CA (US); Industry-Academic Cooperation Foundation, Yonsei, Seoul (KR)

( * ) Notice: Subject to any disclaimer, the term of this patent is extended or adjusted under 35 U.S.C. 154(b) by 220 days.

(21) Appl. No.: 12/769,995

(22) Filed: Apr. 29, 2010

(65) Prior Publication Data

US 2011/0267874 A1    Nov. 3, 2011

(51) Int. Cl.
*G11C 11/00* (2006.01)

(52) U.S. Cl.
USPC ............ 365/158; 365/148; 365/171; 977/933; 977/935

(58) Field of Classification Search ............... 365/48, 365/55, 62, 66, 74, 78, 80–93, 100, 130, 365/131, 148, 158, 171–173, 209, 213, 225.5, 365/230.07, 232, 243.5; 216/22; 257/295, 257/421, E21.665; 438/3; 428/810–816, 428/817–825.1, 826; 977/933–935
See application file for complete search history.

(56) References Cited

U.S. PATENT DOCUMENTS

| 6,166,952 | A  | 12/2000 | Sedlak |
| 7,324,366 | B2 | 1/2008  | Bednorz et al. |
| 7,379,327 | B2 | 5/2008  | Chen et al. |
| 7,394,685 | B2 | 7/2008  | Ooishi et al. |
| 7,436,699 | B2 | 10/2008 | Tanizaki et al. |
| 8,040,154 | B2 * | 10/2011 | Chua-Eoan et al. ............ 326/40 |
| 8,144,509 | B2 | 3/2012  | Jung et al. |
| 2007/0279968 | A1 | 12/2007 | Luo et al. |
| 2007/0285974 | A1 | 12/2007 | Takemura et al. |

(Continued)

FOREIGN PATENT DOCUMENTS

| EP | 1566810 A2 | 8/2005 |
| JP | 2007184063 A | 7/2007 |
| RU | 2190885 C2 | 10/2002 |
| WO | WO 2009158274 A1 | 12/2009 |

OTHER PUBLICATIONS

M. Hosomi, et al., A Novel Nonvolatile Memory with Spin Transfer Torque Magnetoresistive Magnetization Switching: Spin-RAM, proceedings of IEDM conference (2005), Dec. 2005.

(Continued)

*Primary Examiner* — Harry W Byrne
(74) *Attorney, Agent, or Firm* — Sam Talpalatsky; Nicholas J. Pauley; Joseph Agusta

(57) ABSTRACT

In a Spin Transfer Torque Magnetoresistive Random Access Memory (STT-MRAM) a bit cell array can have a source line substantially parallel to a word line. The source line can be substantially perpendicular to bit lines. A source line control unit includes a common source line driver and a source line selector configured to select individual ones of the source lines. The source line driver and source line selector can be coupled in multiplexed relation. A bit line control unit includes a common bit line driver and a bit line selector in multiplexed relation. The bit line control unit includes a positive channel metal oxide semiconductor (PMOS) element coupled between the common source line driver and bit line select lines and bit lines.

11 Claims, 18 Drawing Sheets

U.S. PATENT DOCUMENTS

| | | |
|---|---|---|
| 2008/0219044 A1 | 9/2008 | Yoon et al. |
| 2010/0128519 A1* | 5/2010 | Li et al. ......................... 365/171 |
| 2010/0194431 A1* | 8/2010 | Chua-Eoan et al. ............ 326/40 |
| 2011/0000303 A1 | 1/2011 | Fortner et al. |
| 2011/0051520 A1* | 3/2011 | Kim ......................... 365/185.19 |

OTHER PUBLICATIONS

International Search Report and Written Opinion—PCT/US2011/032900, ISA/EPO—Sep. 5, 2011.

\* cited by examiner

PARALLEL MAGNETIZATION
LOW RESISTANCE
STATE "0"

ANTIPARALLEL MAGNETIZATION
HIGH RESISTANCE
STATE "1"

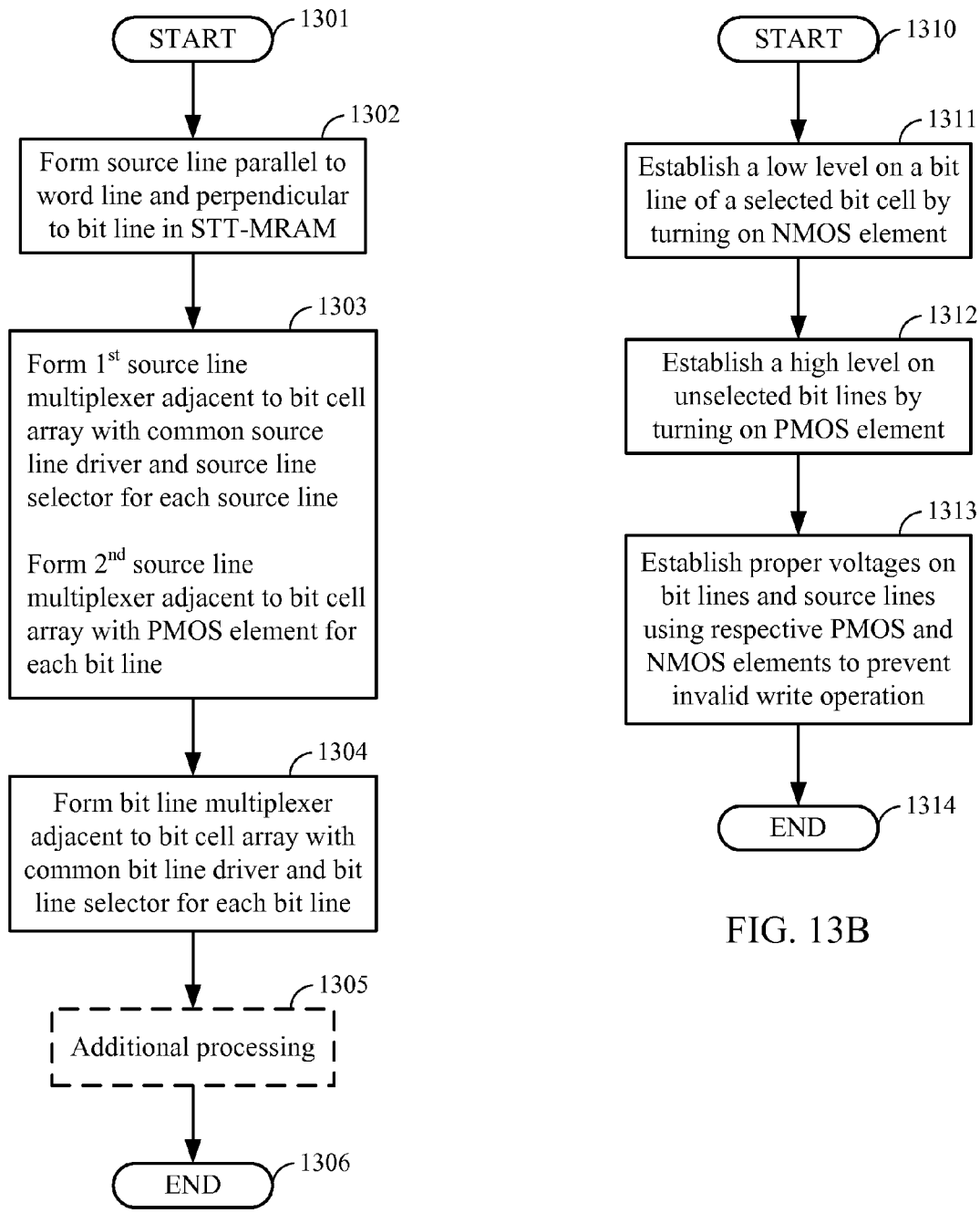

INVALID WRITE PREVENTION FOR STT-MRAM ARRAY

REFERENCE TO CO-PENDING APPLICATIONS FOR PATENT

The present Application for Patent is related to the following co-pending U.S. Patent Application entitled: "WRITE OPERATION FOR SPIN TRANSFER TORQUE MAGNETORESISTIVE RANDOM ACCESS MEMORY WITH REDUCED BIT CELL SIZE" by Seong-Ook Jung et al., filed on Jun. 27, 2008, application Ser. No. 12/163,359, assigned to the assignee hereof, and expressly incorporated by reference herein.

FIELD OF DISCLOSURE

The present disclosure is related to random access memories (RAM). More particularly, the present disclosure is related to preventing invalid write operations in a spin transfer torque (STT) magnetoresistive RAM (STT-MRAM).

BACKGROUND

Random access memory (RAM) is commonly provided in computer systems. Common architectures provide RAM that can be embodied as a stand alone device or can be integrated or embedded within devices such as microprocessors, microcontrollers, application specific integrated circuits (ASICs), system-on-chip (SoC), and other like devices, as will be appreciated. Volatile RAM loses its stored information whenever power is removed. Non-volatile RAM can maintain its memory contents even when power is removed from the memory. Although nonvolatile RAM has advantages, conventional non-volatile RAM has slower read and write times when compared to, for example, volatile RAM.

Advanced memory technology has evolved to provide increasing access speed even for non-volatile memory types. For example, Magnetoresistive Random Access Memory (MRAM) is a non-volatile memory technology that has read and write response times comparable to that of volatile memory. In contrast to conventional RAM technologies, which store data as electric charges or current flows, MRAM uses magnetic elements. As illustrated in FIG. 1A and FIG. 1B, a magnetic tunnel junction (MTJ) storage element 100 can be formed from two magnetic layers 110 and 130, each of which can hold a magnetic field, separated by an insulating layer 120, which can be, for example a tunnel barrier layer, or the like. One of the two layers such as fixed layer 110, is set to a particular polarity. The polarity 132 of the other layer, such as free layer 130, is free to change to match that of an external field that can be applied. A change in the polarity 132 of the free layer 130 will change the resistance of the MTJ storage element 100. For example, as shown in FIG. 1A, when the polarities are aligned, a low resistance state exists. When the polarities are not aligned, as shown in FIG. 1B, a high resistance state exists. The illustration of MTJ 100 has been simplified and it will be appreciate that each layer illustrated may include one or more layers of materials, as is known in the art.

Referring to FIG. 2A, a memory cell 200 of a conventional MRAM is illustrated for a read operation. The cell 200 includes a transistor 210, bit line 220, digit line 230 and word line 240. The cell 200 can be read by measuring the electrical resistance of the MTJ 100. For example, a particular MTJ 100 can be selected by activating an associated transistor 210, which can switch current from a bit line 220 through the MTJ 100. Due to the tunnel magnetoresistive effect, the electrical resistance of the MTJ 100 changes based on the orientation of the polarities in the two magnetic layers (e.g., 110, 130), as discussed above. The resistance inside any particular MTJ 100 can be determined from the current, resulting from the polarity of the free layer. Conventionally, if the fixed layer 110 and free layer 130 have the same polarity, the resistance is low and a "0" is read. If the fixed layer 110 and free layer 130 have opposite polarity, the resistance is higher and a "1" is read.

Referring to FIG. 2B, the memory cell 200 of a conventional MRAM is illustrated for a write operation. The write operation of the MRAM is a magnetic operation. Accordingly, transistor 210 is off during the write operation. Current is propagated through the bit line 220 and digit line 230 to establish magnetic fields 250 and 260 that can affect the polarity of the free layer of the MTJ 100 and consequently the logic state of the cell 200. Accordingly, data can be written to and stored in the MTJ 100. MRAM has several desirable characteristics that make it a candidate for a universal memory. The characteristics can include high speed, high density or small bitcell size, low power consumption, and no degradation over time. However, MRAM has scalability issues. Specifically, as the bit cells become smaller, the magnetic fields used for switching the memory state increase. Accordingly, current density and power consumption increase to provide the higher magnetic fields, thus limiting the scalability of the MRAM.

Unlike conventional MRAM, STT-MRAM uses electrons that become spin-polarized as the electrons pass through a thin film which functions as a spin filter. STT-MRAM is also known as Spin Transfer Torque RAM (STT-RAM), Spin Torque Transfer Magnetization Switching RAM (Spin-RAM), and Spin Momentum Transfer (SMT-RAM). During the write operation, the spin-polarized electrons exert a torque on the free layer, which can switch the polarity of the free layer. The read operation is similar to conventional MRAM in that a current is used to detect the resistance or the logic state of the MTJ storage element, as discussed in the foregoing. As illustrated in FIG. 3A, a STT-MRAM bit cell 300 includes MTJ 305, transistor 310, bit line 320 and word line 330. The transistor 310 is switched on for both read and write operations to allow current to flow through the MTJ 305, so that the logic state can be read or written.

Referring to FIG. 3B, a more detailed diagram of a STT-MRAM cell 301 is illustrated, for further discussion of the read/write operations. In addition to the previously discussed elements such as MTJ 305, transistor 310, bit line 320 and word line 330, a source line 340, sense amplifier 350, read/write circuitry 360 and bit line reference 370 are illustrated. As discussed above, the write operation in an STT-MRAM is electrical. Read/write circuitry 360 generates a write voltage between the bit line 320 and the source line 340. Depending on the polarity of the voltage between bit line 320 and source line 340, the polarity of the free layer of the MTJ 305 can be changed and correspondingly the logic state can be written to the cell 301. Likewise, during a read operation, a read current is generated, which flows between the bit line 320 and source line 340 through MTJ 305. When the current is permitted to flow via transistor 310, the resistance (logic state) of the MTJ 305 can be determined based on the voltage differential between the bit line 320 and source line 340, which is compared to a reference 370 and then amplified by sense amplifier 350. It will be appreciated that the operation and construction of the memory cell 301 is known in the art. Additional details are provided, for example, in M. Hosomi, et al., A Novel Nonvolatile Memory with Spin Transfer Torque Magnetoresistive Magnetization Switching: Spin-RAM, proceedings of IEDM conference (2005), which is incorporated herein by reference in its entirety.

The electrical write operation of STT-MRAM eliminates the scaling problem due to the magnetic write operation in MRAM. Further, the circuit design is less complicated for STT-MRAM. In a conventional arrangement of the STT-MRAM array, such as illustrated in FIG. 4A, the source line (SL) is orthogonal to word line (WL) and is parallel with the bit line (BL). This arrangement increases the area used for the bit cell array and results in large bit cell size. The conventional arrangement promotes a stable write operation. For example, during the write operation, for writing a state of "1" the following conditions are satisfied WL=H, BL=L and SL=H for the selected bit cell 410 and a proper write operation can be performed. As used herein H represents a high voltage or logic level and L represents a low voltage or logic level. For the unselected bit cells 420, the WL=H, BL=L and SL=L and thus there is no invalid write operation on the unselected bit cells. However, while aiding in preventing invalid write operations, the conventional arrangement is inefficient in the area used per bit cell since the line cannot be shared which results in additional metal 1 which is illustrated as "SL(M1)" for a source line as shown in FIG. 4B. As further illustrated in the circuit layout of FIG. 4B, each bit line (BL) can be located on another metal layer "Mx" running substantially in parallel with the source lines.

SUMMARY

Exemplary embodiments are directed to an exemplary Spin Transfer Torque

Magnetoresistive Random Access Memory (STT-MRAM) including a bit cell array having a source line substantially parallel to a word line. The source line is coupled to first bit cells of the bit cell array and is substantially perpendicular to bit lines that are also coupled to the bit cells. A source line control unit is coupled to the bit cell array and includes a common source line driver coupled to a plurality of source lines and a source line selector configured to select individual ones of the plurality of source lines. The source line driver and the source line selector coupled in multiplexed relation.

In accordance with another embodiment, an exemplary method of making an STT-MRAM bit cell array includes forming a first source line of the bit cell array substantially parallel to a word line of the bit cell array, the first source line and the word line formed substantially perpendicular to bit lines of the bit cell array. A source line multiplexer can be formed adjacent to the bit cell array and coupled thereto. The source line multiplexer can include a common source line driver and a source line selector configured to select individual ones of a plurality of source lines including the first source line.

In accordance with still another embodiment, an exemplary method for writing data in an STT-MRAM having a source line substantially parallel to a word line coupled to bit cells, the source line substantially perpendicular to bit lines coupled to the bit cells, includes establishing a low level on a bit line of a selected bit cell coupled to the word line of the first row of bit cells and the source line, establishing a high level on bit lines of unselected ones of the bit cells coupled to the word line of the first bit cells and the source line, and preventing an invalid write operation by isolating the bit line and the source line with a positive channel metal oxide semiconductor (PMOS) element.

In accordance with still another embodiment, an STT-MRAM having a source line substantially parallel to a word line coupled to bit cells, the source line substantially perpendicular to the bit lines coupled to the bit cells, include means for establishing a low voltage on a bit line of a selected bit cell coupled to the word line of the first row of bit cells and the source line, means for establishing a high voltage on bit lines of unselected ones of the bit cells coupled to the word line of the bit cell and the source line, and positive channel metal oxide semiconductor (PMOS) means for preventing an invalid write operation by isolating the bit line and the source line. It will be appreciated that structure in support of the exemplary means can be found, for example, in the various elements described herein below such as the source line and bit line control units, invalid write prevention units and other elements.

BRIEF DESCRIPTION OF THE DRAWINGS

The accompanying drawings are presented to aid in the description of embodiments of the invention and are provided solely for illustration of the embodiments and not limitation thereof

FIG. 13A is a flow chart illustrating portions of an exemplary method for making an STT-MRAM array.

FIG. 13B is a flow chart illustrating portions of an exemplary method for writing to an STT-MRAM array.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Figure 5:
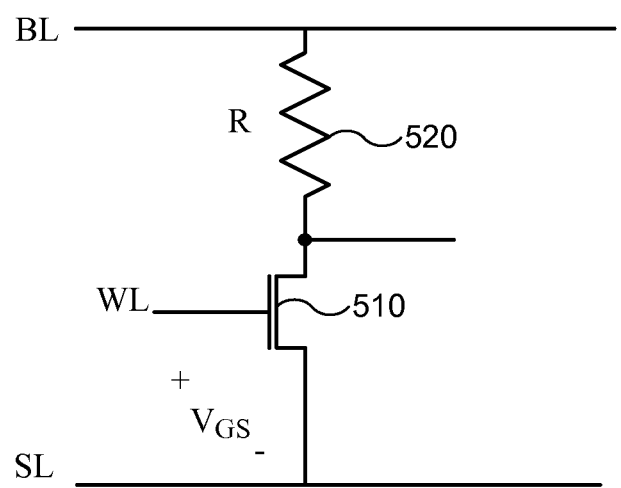
FIG. 5 is a simplified schematic diagram illustrating an exemplary STT-MRAM bit cell.

A simplified schematic of a STT-MRAM bit cell, as shown in FIG. 5, shows a word line (WL) coupled to a word line transistor, 510. A storage element 520, which can be an MTJ storage element as described herein, is represented as a simple resistance. The transistor 510 and storage element 520 are disposed between a bit line (BL) and a source line (SL). During various operations associated with access states such as memory read and write states, the write line, source line, and bit line can be set to and can achieve various levels. For example, the WL, BL and SL can be capable of achieving a H level, an L level, a floating level (F), and a $V_{THP\_LV}$ level. As used herein, H is a high voltage or logic level, L is a low voltage or logic level, F is a floating level that would be achieved due to a high impedance state at the node with respect to a reference, and $V_{THP\_LV}$ is a level associated with a pre-charge threshold voltage level. The H and L voltage or logic levels may be supply and reference voltage levels such as Vcc and Vref or 0V or may be higher or lower than the supply voltages levels. It will be appreciated that the foregoing arrangement and state conditions and associated illustrations are provided merely for discussion of exemplary embodiments and are not intended to be limiting in any way. As used herein, the term "access" or "access operation" refers to access operations for reading the contents of the memory bit cell and access operations for modifying or writing contents to the memory bit cell as will be understood.

Figure 1A:
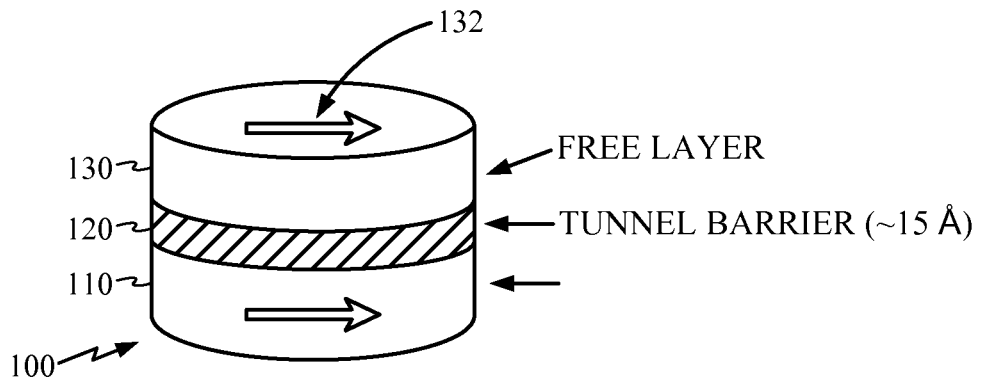
FIG. 1A and FIG. 1B are diagrams illustrating exemplary states of a conventional magnetic tunnel junction (MTJ) storage element.
Figure 1B:
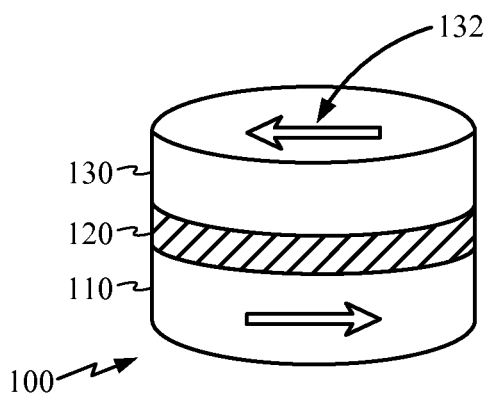
Figure 2A:
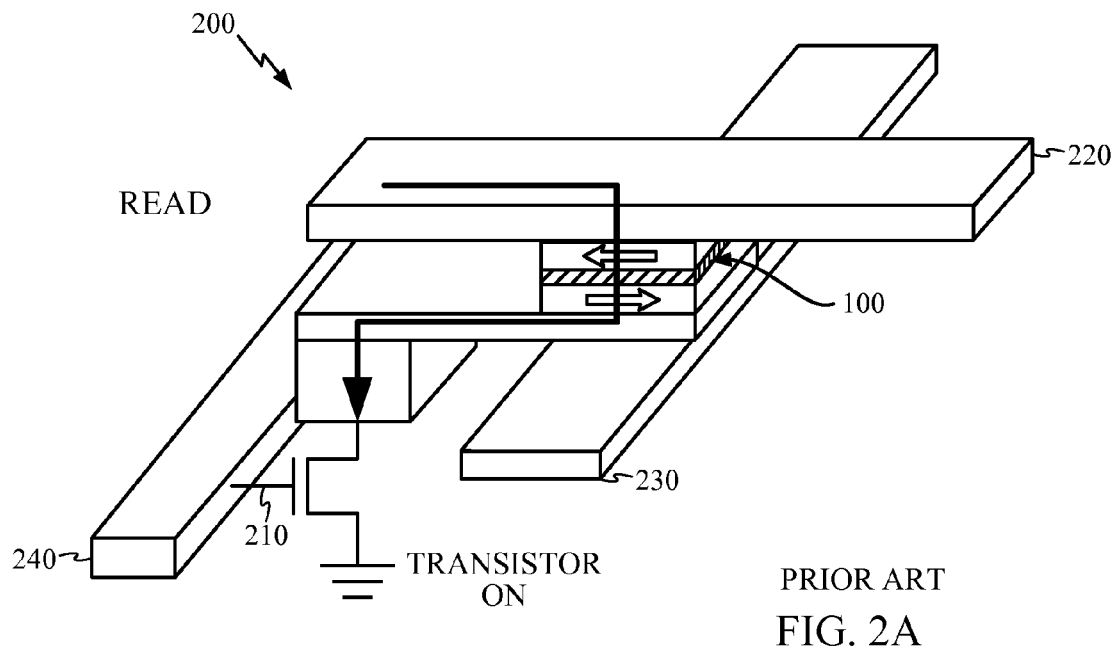
FIG. 2A and FIG. 2B are diagrams illustrating a conventional Magnetoresistive Random Access Memory (MRAM) cell during exemplary operations.
Figure 2B:
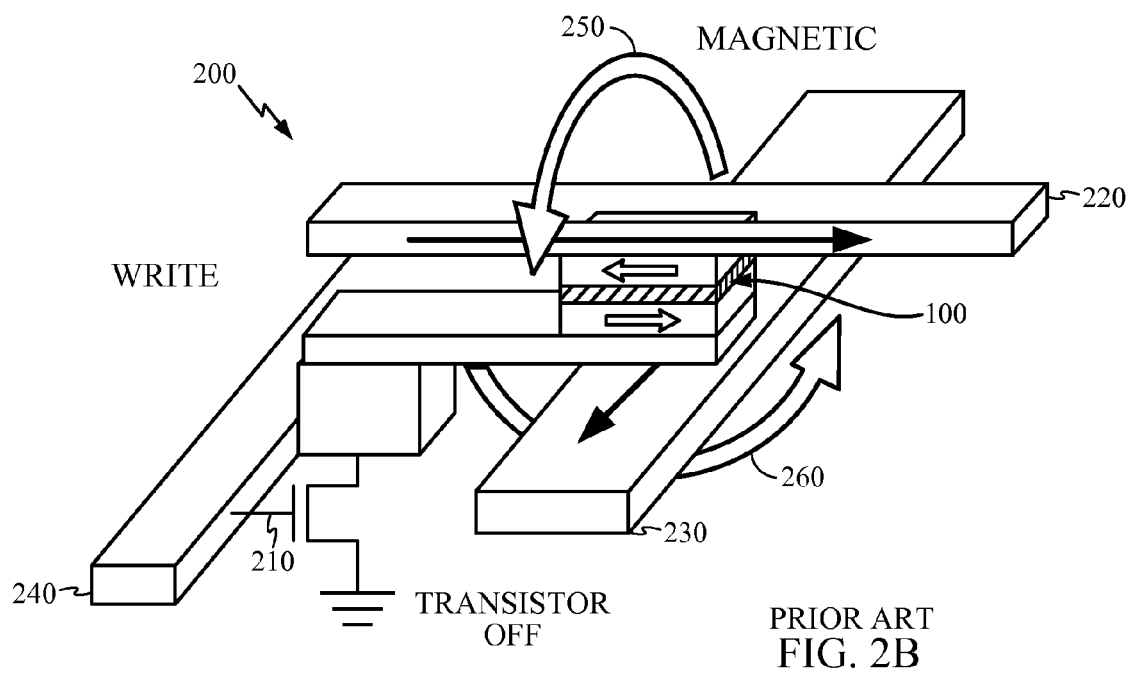
Figure 3A:
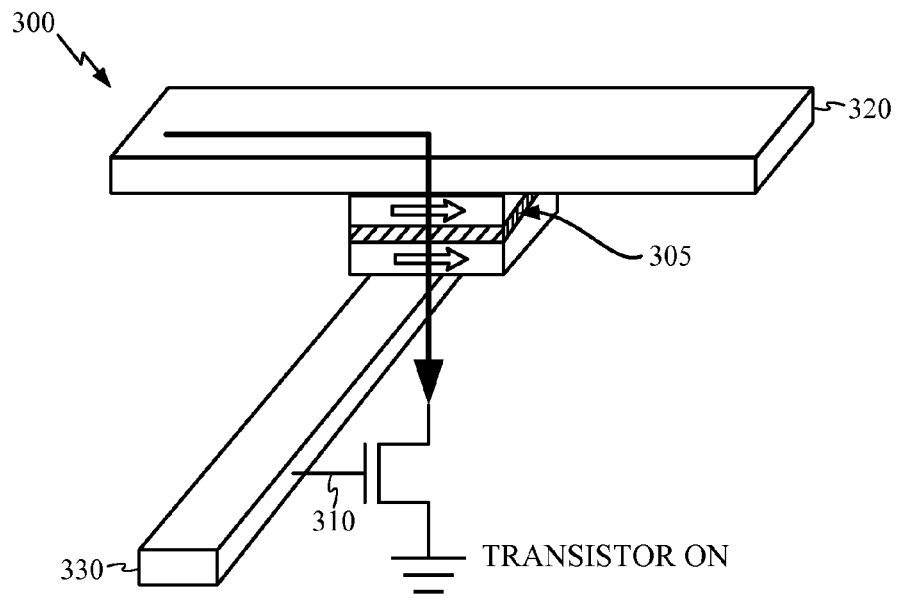
FIG. 3A and FIG. 3B are diagrams illustrating conventional Spin Transfer Torque Magnetoresistive Random Access Memory (STT-MRAM) bit cells.
Figure 3B:
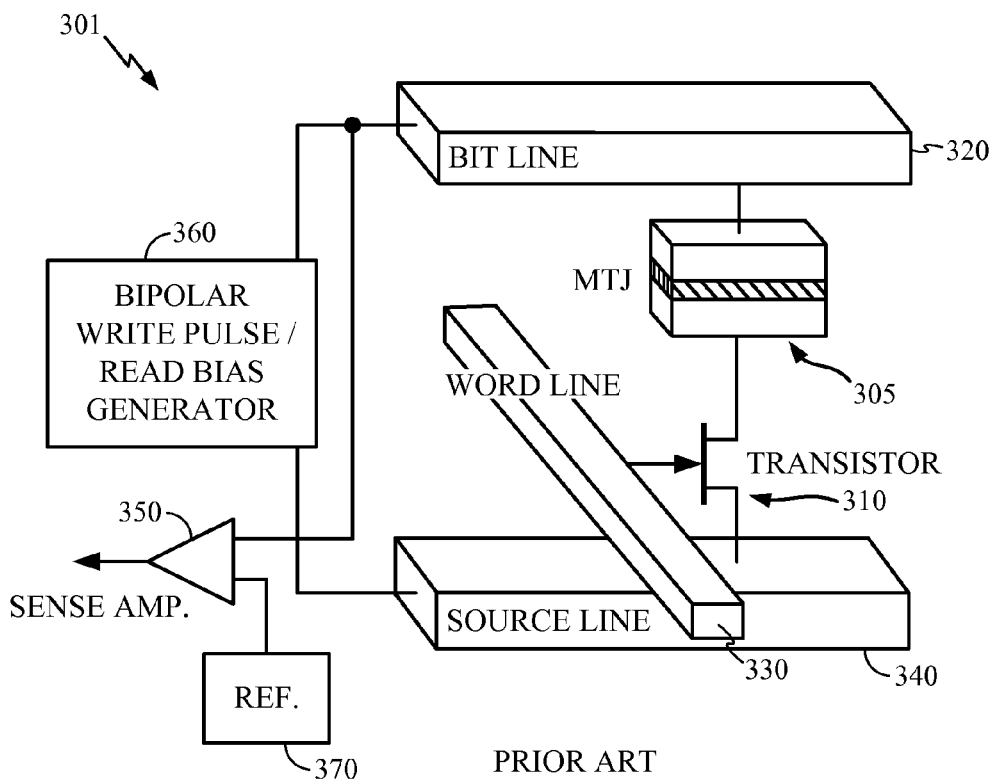
Figure 4A:
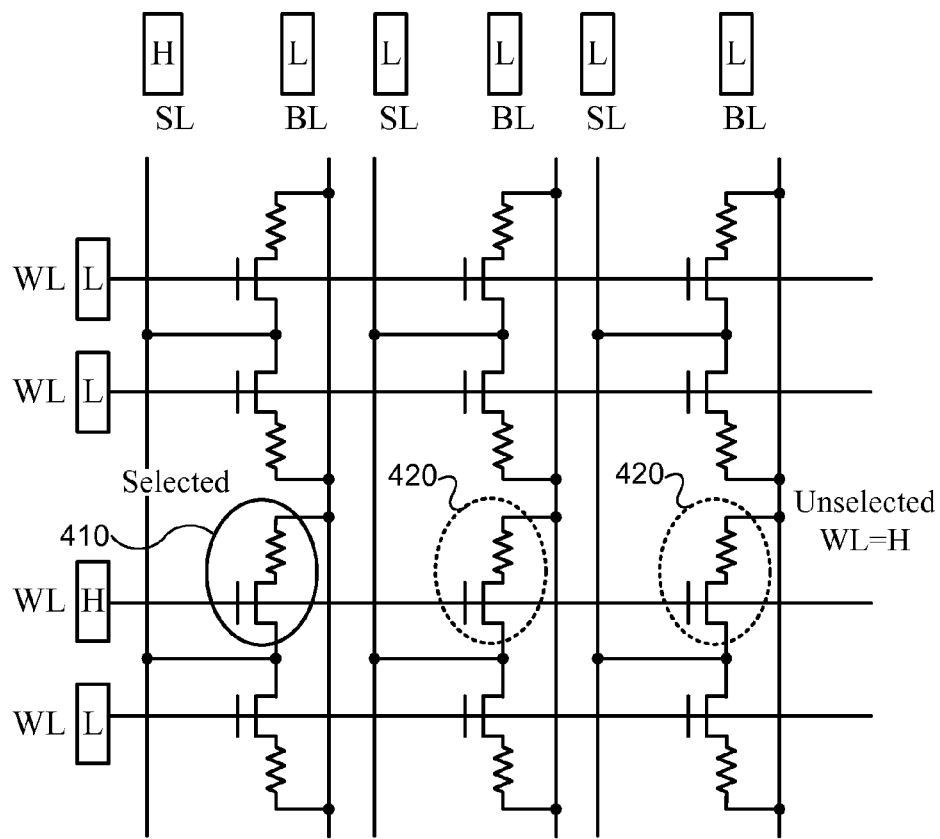
FIG. 4A is a schematic diagram illustrating a conventional bit cell arrangement for a STT-MRAM and FIG. 4B is a diagram illustrating an exemplary layout of a conventional bit cell arrangement for a STT-MRAM.
Figure 6A:
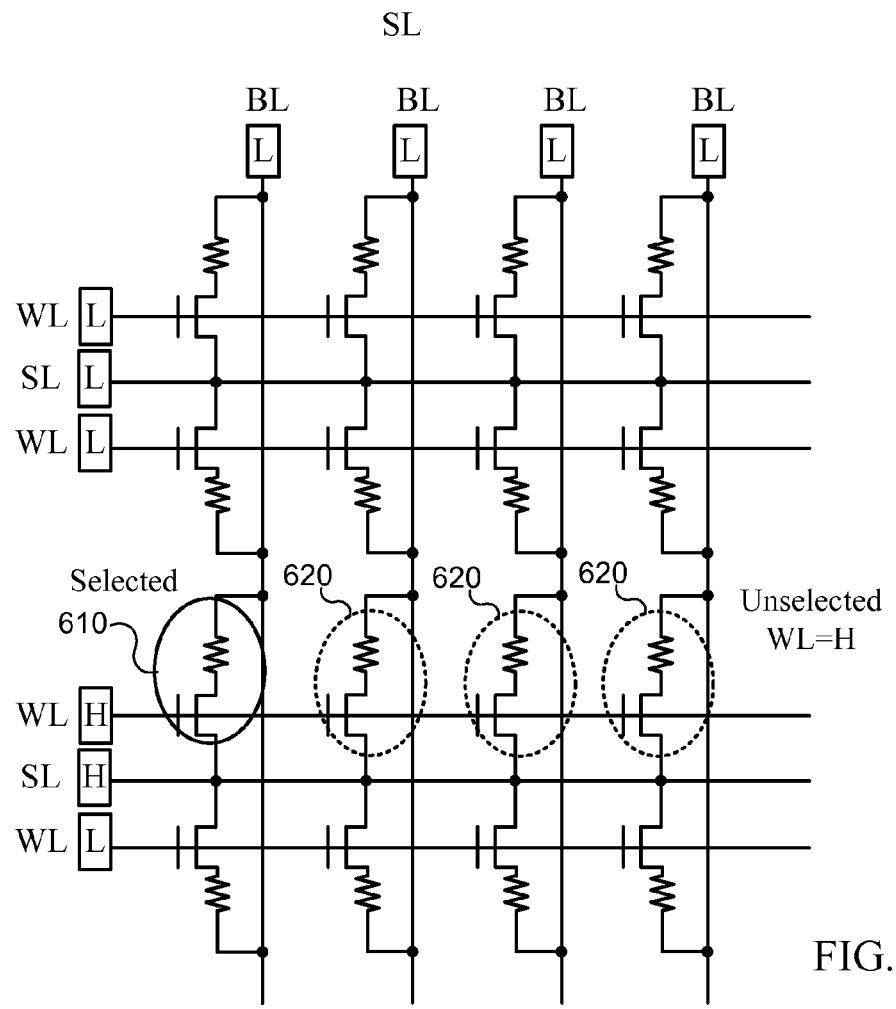
FIG. 6A is a schematic diagram illustrating an exemplary reduced size bit cell arrangement for a STT-MRAM using conventional write logic and FIG. 6B is a diagram illustrating an exemplary layout of a reduced size bit cell arrangement.

As shown in FIG. 6A, an arrangement of a STT-MRAM bit cell array can result in a reduced or minimum bit cell size according various exemplary embodiments as described herein. In contrast to a conventional design, such as that illustrated in FIG. 4A and FIG. 4B, the word lines (WL) and source lines (SL) are arranged substantially in parallel and substantially perpendicular to the bit lines (BL). For example, in accordance with various embodiments, such as the embodiment shown in FIG. 6A and FIG. 6B, when compared to the layout illustrated in FIG. 4B in which the source line is parallel to the bit line and perpendicular to the word line, the vertical metal 1 corresponding to the source line can be eliminated and the bit cell area significantly reduced.

Figure 4B:
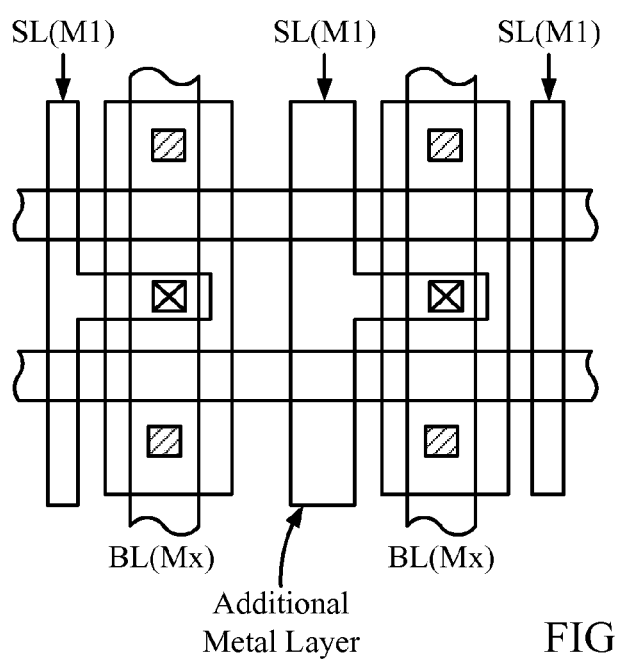
Figure 6B:
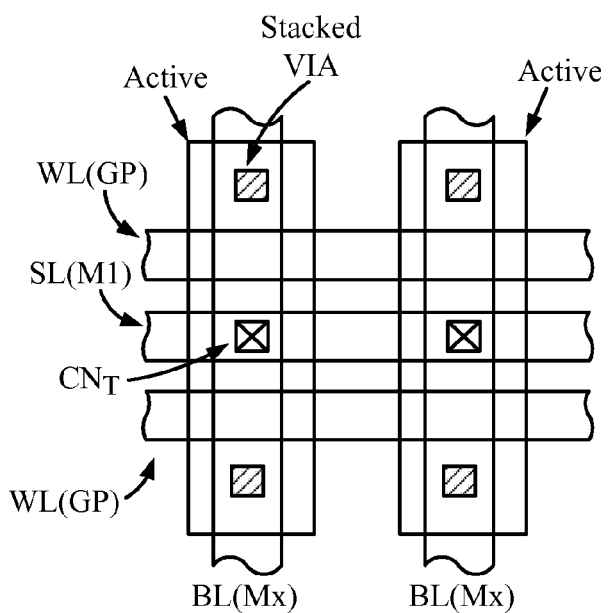

According to an exemplary configuration, such as that of FIG. 6B, the reduced cell size is provided by allowing for the removal of the additional parallel metal lines and connections used for the source line, for example as illustrated in FIG. 4B. Further, for example according to the illustrated arrangement, the source line can be shared for all cells along a given word line direction. In some embodiments of the invention, the source line can be shared between two adjacent bit cells and can be positioned between the word lines, such as lines shown as, WL (Gp)) in FIG. 6B. While groups of bit cells can be referred to herein as rows of bit cells or access can be referred to as row addressing, the term is not intended to be limiting and can refer to an arrangement of bit cells, for example, by reference to addressability or grouping. When referring to parallel or perpendicular relation between lines such as source lines, word lines, and bit lines, it will be appreciated that such terms can refer to the orientation of the lines, for example as arranged in relation to each other in an integrated circuit cell, or the like.

While the exemplary layout described above reduces cell size, using the conventional logic for write operations can give rise to an invalid write operation in the unselected cells 620. For example, in a write operation of a "1", the selected cell 610 has WL=H, BL=L and SL=H. However, the unselected bit cells 620 will also be subject to an invalid write because each will have similar signals applied (i.e, WL=H, BL=L and SL=H). Accordingly, using conventional write logic in a reduced bit cell size design can lead to problems during memory write operations.

Figure 7:
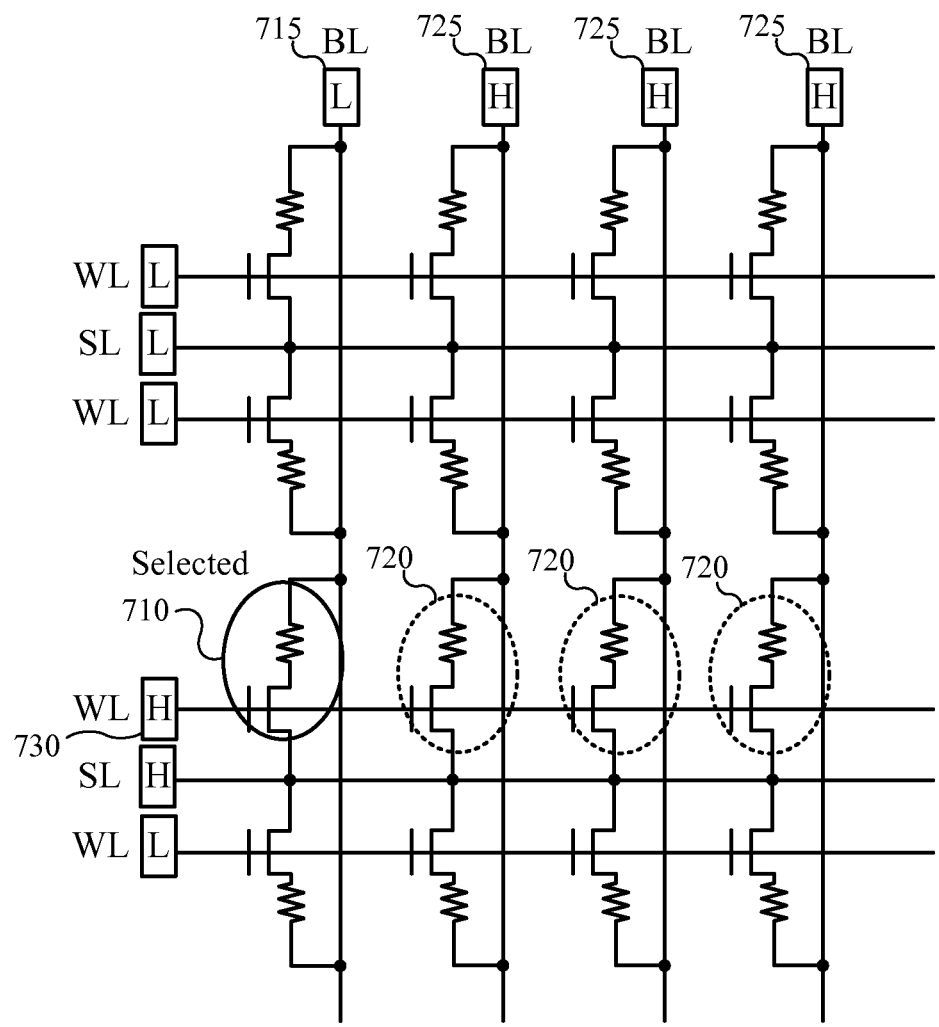
FIG. 7 is a diagram illustrating an exemplary reduced size bit cell arrangement for a STT-MRAM including write logic levels.

FIG. 7 illustrates one solution to the aforementioned problems for write operations in reduced bit cell designs for STT-MRAM, such as where the WL and SL are parallel, according to embodiments described in co-pending application Ser. No. 12/163,359. With reference to FIG. 7, the unselected bit lines 725 can be driven to a high state during write "1" operations to resolve invalid write operations for unselected bit-cells 720. For example, when writing a "1" to the selected bit cell 710, the write logic sets WL(730)=H, BL(715)=L and SL(740)=H. Accordingly, unselected bit-cells 720 also have WL(730)=H, and SL(740)=H during the write operation of bit cell 710. Then, to prevent an invalid write operation in the unselected bit cells 720, unselected BLs 725 are set to H during the write cycle for writing "1" to the selected bit cell 710. It can be appreciated that the write control logic for the unselected bit lines will be designed to apply a high (H) voltage or logic signal during the write operations. Alternatively, the unselected bit lines can be placed in a high impedance state, which would prevent any current flow through the unselected bit lines. The write control logic can be implemented using any device or combination of devices that can perform the functionality described herein. Accordingly, embodiments of the invention are not limited to the specific circuits or logic illustrated herein to perform the functionality described.

Figure 8A:
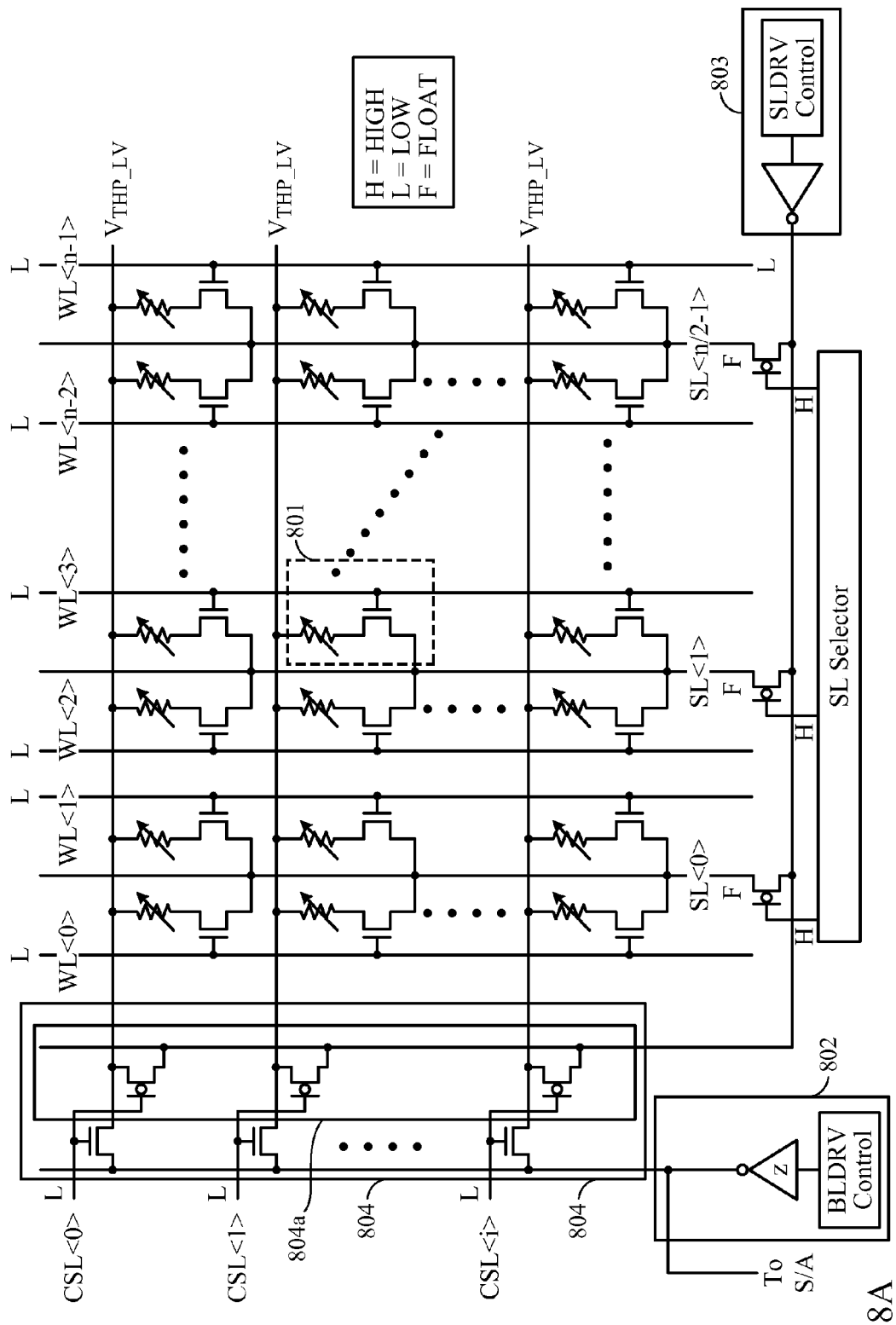
FIG. 8A is a schematic diagram illustrating an exemplary STT-MRAM array.

One exemplary embodiment of an STT-MRAM array including selector and driver arrangements is illustrated in FIG. 8A through FIG. 8D. An exemplary embodiment showing the application of multiple arrays is shown in FIG. 8E. With reference to FIG. 8A, in, for example, a quiescent state, the word lines (WLs) and bit lines (BLs) can be set to a L level while setting the source line (SL) select lines to H results in a floating level on the source lines (SLs). The bit lines correspondingly attain a pre-charge level $V_{THP\_LV}$ by setting the output of SL driver to a L level and are ready for access operations.

Figure 8B:
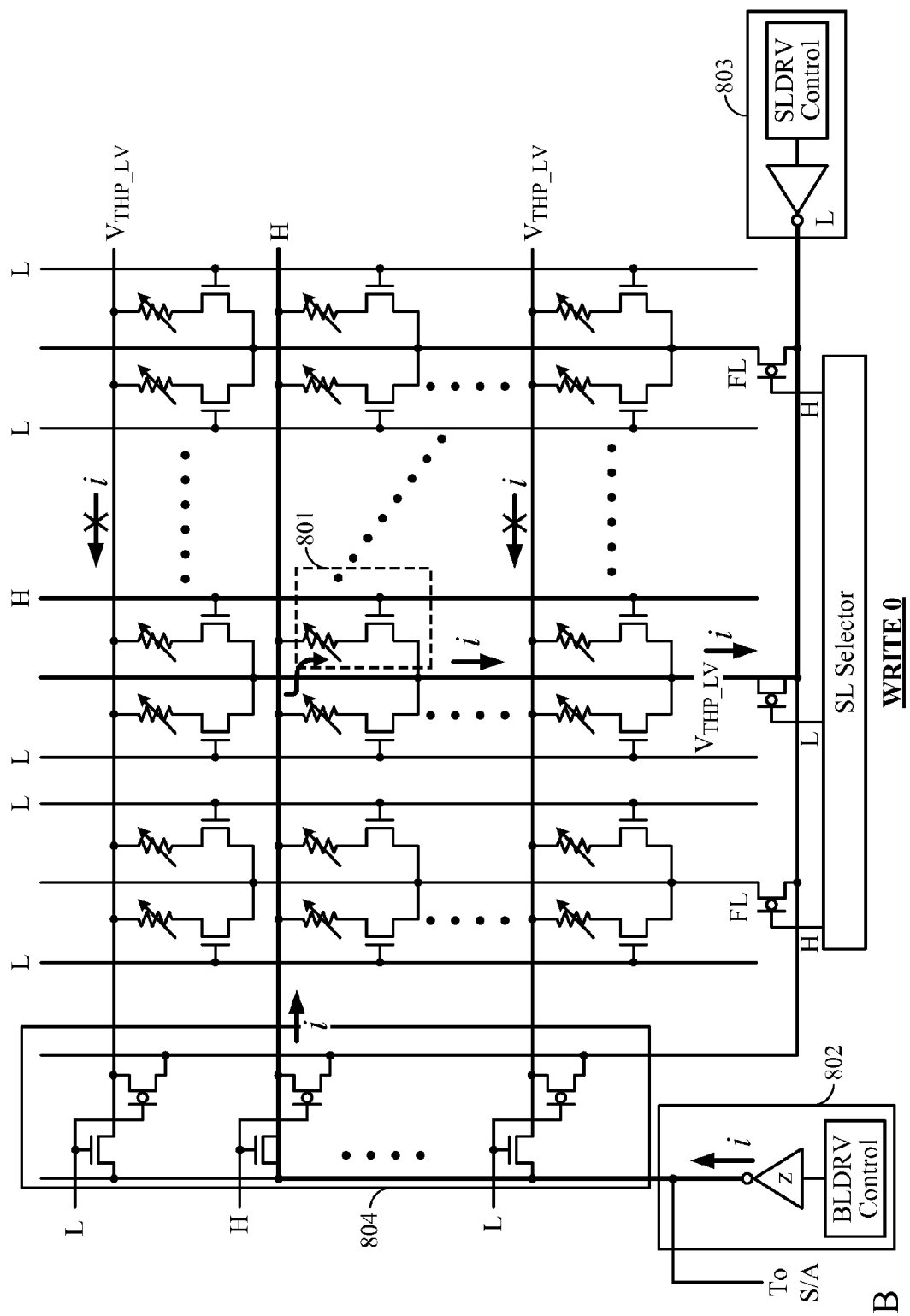
FIG. 8B is a schematic diagram illustrating an exemplary STT-MRAM array during an access operation.
Figure 8C:
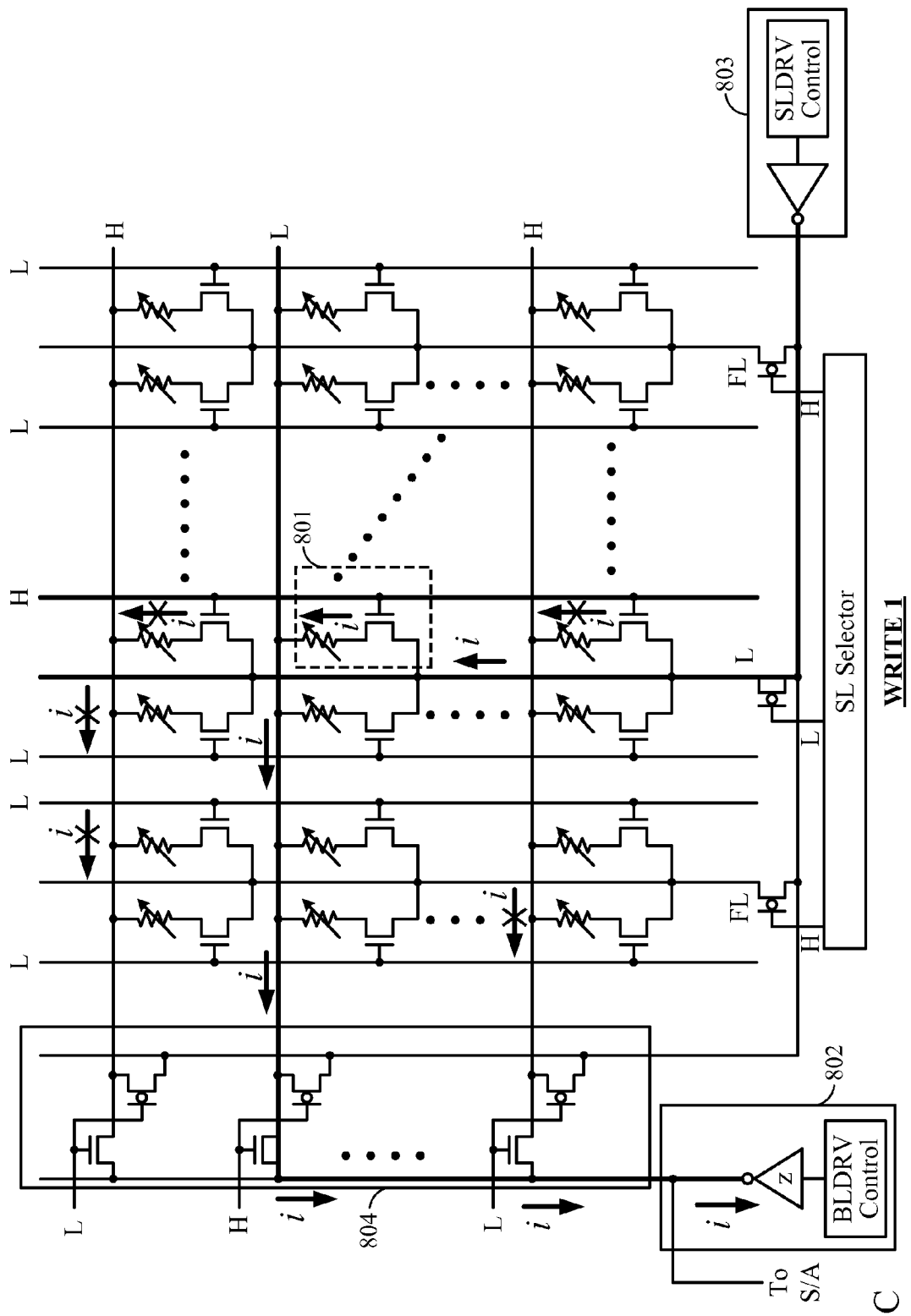
FIG. 8C is a schematic diagram illustrating an exemplary STT-MRAM array during another access operation.

When performing an access operation for writing, for example, a "0" to the memory cell 801, as shown in FIG. 8B, the unselected BL select signals in the array are set to an L state while the selected BL select signal associated with memory cell 801 is set to an H state in one example of a write "0" configuration. The unselected BL lines themselves can take on a pre-charge level $V_{THP\_LV}$, while the selected BL is set to a H level. The unselected SL select lines are set to H causing the unselected SLs to an F level. The selected SL select line is set to an L level and the SL driver is set to an L and the selected SL correspondingly attains the pre-charge level $V_{THP\_LV}$. Thus, current flows from the BL driver 802 through the memory cell 801 and the SL driver 803. When performing an access operation for writing, for example, a "1" to the memory cell 801, as shown in FIG. 8C, the unselected BL select signals in the array are set to an L state while the selected BL select signal associated with memory cell 801 is set to an H state in one example of a write "1" configuration. The unselected BL lines themselves can take on an H level, while the selected BL is set to an L level. The unselected SL select lines are set to an H level causing the unselected SLs to an F level. The selected SL select line is set to an L level and the SL driver is set to an H level and the selected SL correspondingly attains an H level. Thus, current flows in a reverse direction as compared to the write "0" configuration of FIG. 8B, such as from the SL driver 803, through the memory cell 801, and through the BL driver 802.

Figure 8D:
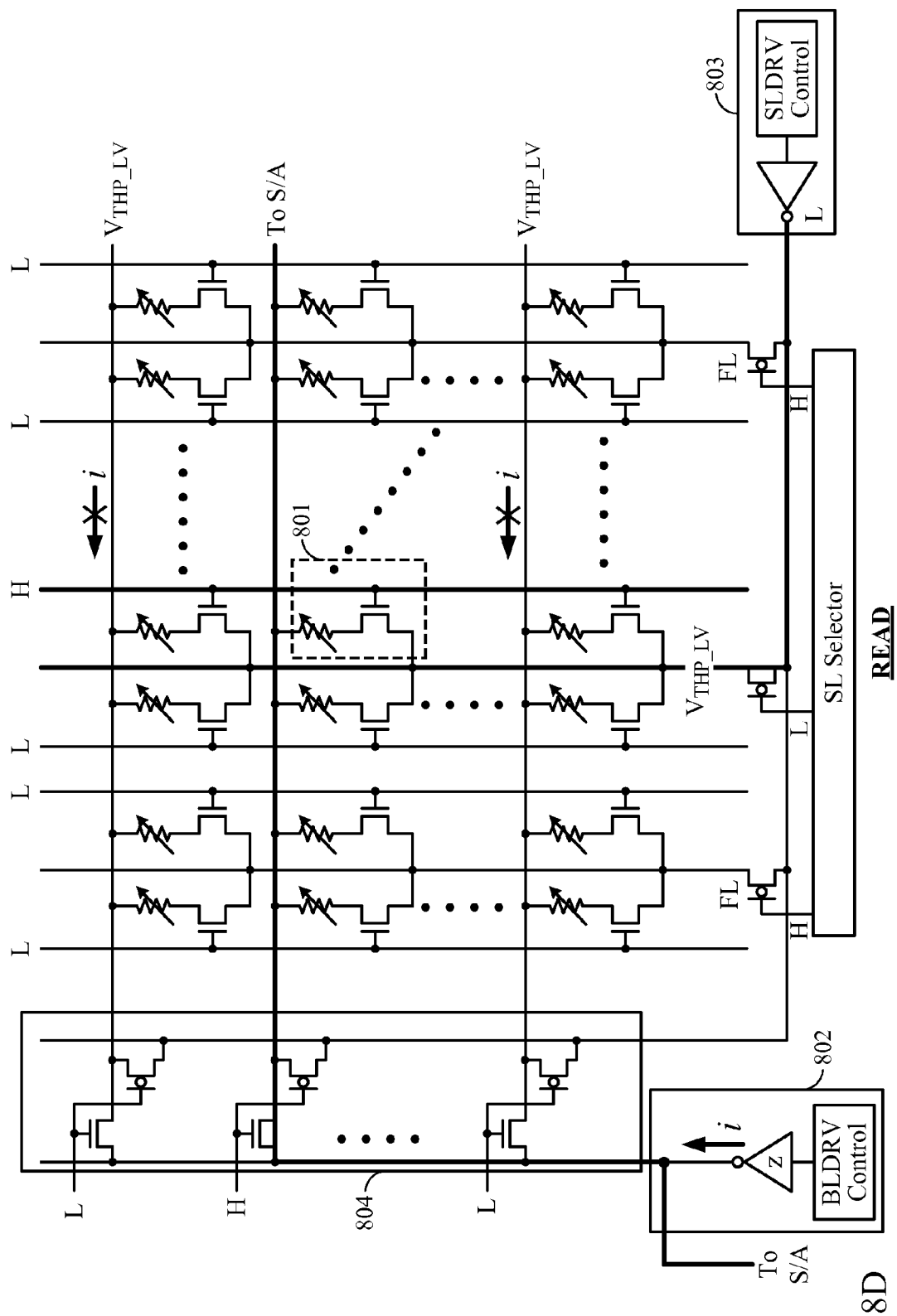
FIG. 8D is a schematic diagram illustrating an exemplary STT-MRAM array during another access operation.
Figure 8E:
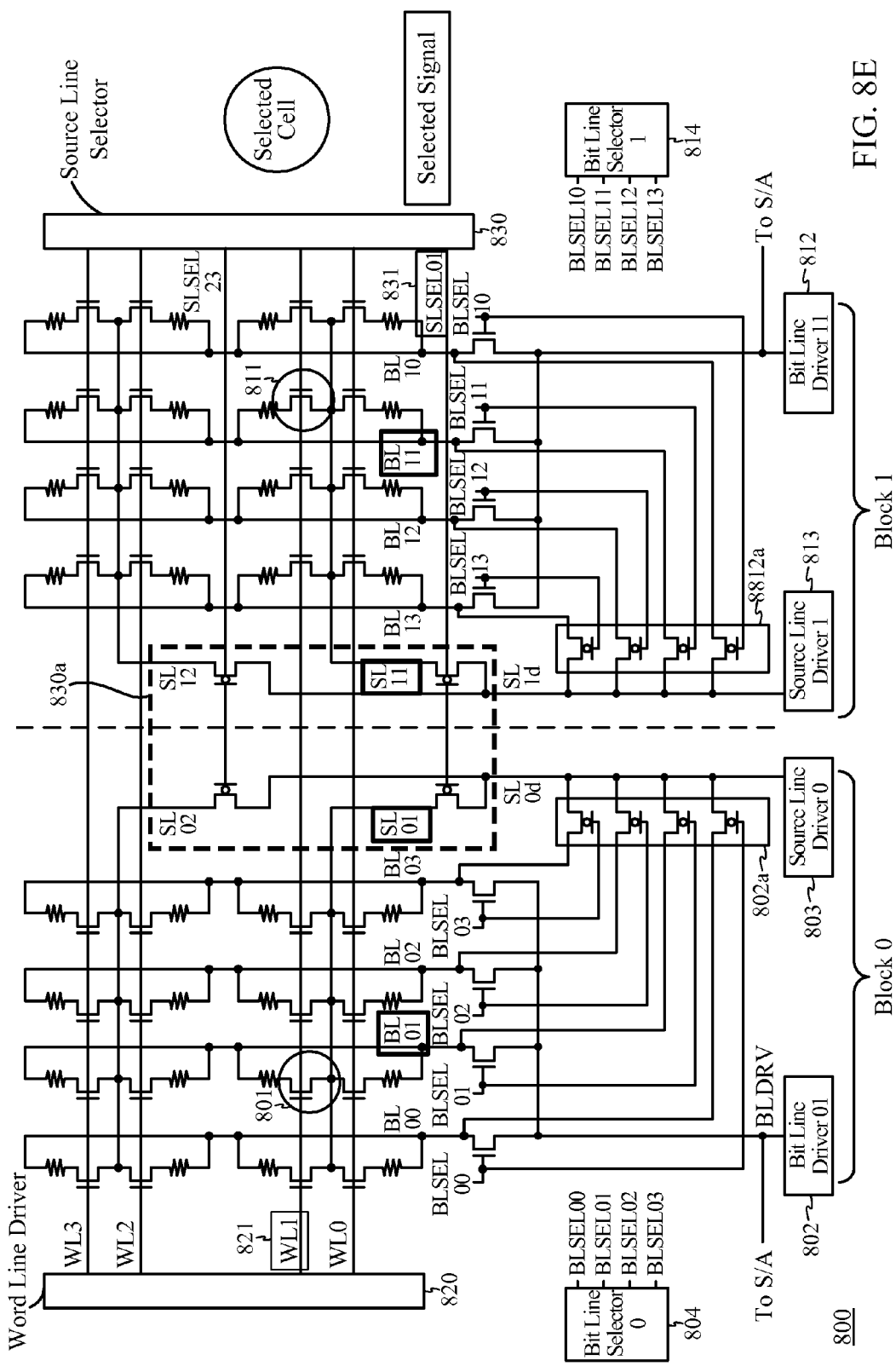
FIG. 8E is a schematic diagram further illustrating aspects of two exemplary STT-MRAM arrays.

When performing an access operation for reading the contents of the memory cell 801, for example as shown in FIG. 8D, the unselected BL select signals in the array are set to an L state while the selected BL select signal associated with memory cell 801 is set to an H state in one example of a read configuration. The unselected BL lines themselves can take on a pre-charge $V_{THP\_IN}$ level, while the selected BL attains a level associated with the stored charge in memory cell 801. The unselected SL select lines are set to an H level causing the unselected SLs to an F level. The selected SL select line is set to an L level and the SL driver is set to an L level and the selected SL correspondingly attains a pre-charge $V_{THP\_LV}$ level. Thus, the contents of memory cell 801 can be read through the sense amplifier S/A (not shown) through the illustrated pathway.

In FIG. 8E, a bank of STT-MRAM bit cell arrays is shown including, in the exemplary configuration, two arrays. It will be appreciated that greater number of arrays can be used in a bank of cells. The select signals are denoted with a rectangular box and the selected cells are denoted with a circle. Accordingly, in order to select bit cells 801 and 811 for access operations, the word line (WL) driver 820 activates the word line WL1 821 including all word line access elements along the word line, such as transistors or switching elements associated with cells 801, 811 and other cells along the word line 821 for potential access. Source line selector 830 activates a select line SLSEL01 831 coupled to source lines SL01 and SL11. Specifically, select line SLSEL01 831 activates transistors, which, as illustrated, can be PMOS transistors, associated with source lines SL01 and SL11, which are coupled to source line drivers 803 and 813, respectively on one side thereof, and are coupled by way of source lines SL01 and SL11 between the pairs of switching elements in the corresponding portions of Block 1 and Block 0 in the illustrated array configuration. Additionally, bit line selectors 804 and 814 select bit lines BL01 and BL11 through activation of bit line select signals BLSEL 01 and BLSEL 11 respectively. Unlike prior drivers, BL drivers 802 and 812, respectively provide a drive current source for all of the bit lines, which can be further coupled to the source line driver through PMOS elements 802a and 812a, which form an invalid write prevention mechanism. The placement and use of PMOS elements 802a and 812a advantageously prevents invalid write during write "1" by delivering "1" voltage to unselected bit lines. The placement and use of PMOS elements 802a and 812a advantageously also prevents invalid write during write "0" by delivering an L level ($V_{THP\_LV}$) to unselected bit lines. As discussed in connection with the examples given above, bit line driver 802 and 812 can be set to an H or an L level depending on the nature of the access operation. The bit line select signal for the selected bit line can be H as described herein above. Accordingly, bit cells 801 and 811 can be selected out of array 800. Although, in accordance with the present example, specific cells are selected in the array for Block 0 and Block 1, it will be appreciated that any cell can be selected using the illustrated logic and the application of the levels as described herein. Further, it is possible that no cells in Block 0 and Block 1 are selected.

Additionally, it will be appreciated that the dimensions of the exemplary STT_MRAM array are arbitrary and can be scaled up or down as needed. The various drivers and selectors can be reconfigured to provide more or less resolution in selecting individual bit cells. While a more detailed discussion of specific implementations of the logical blocks illustrated is provided below, the details are provided as examples and are not intended to be limiting of the exemplary embodiments to the illustrated circuits, logic or features discussed and described herein.

Figure 9:
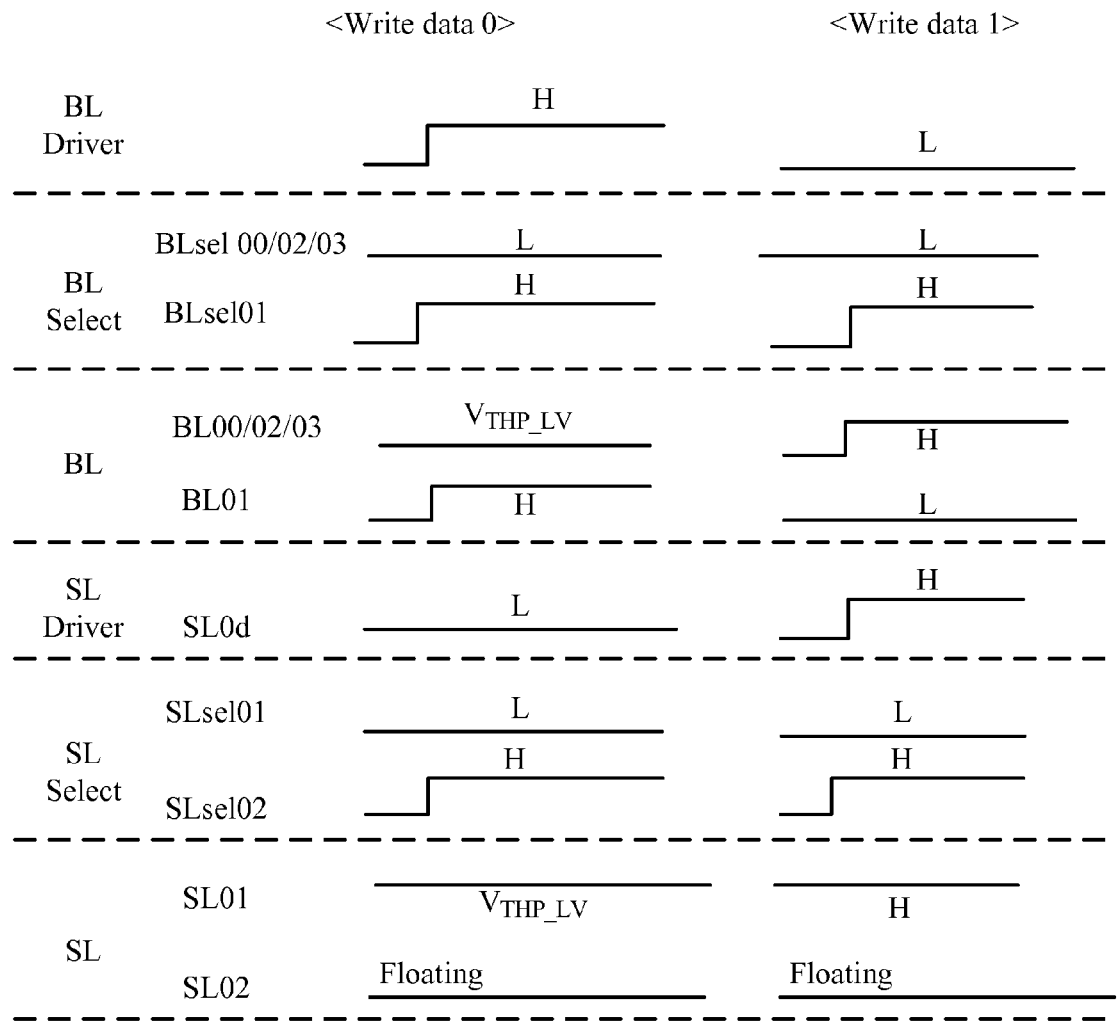
FIG. 9 is a diagram illustrating exemplary signaling timing for a block memory in the STT-MRAM arrays of FIG. 8E.

FIG. 9 is a timing diagram that illustrates exemplary signaling related access operations for the STT_MRAM arrays shown, for example, in FIG. 8B and -FIG. 8C and at least one of the arrays in FIG. 8E. In the list below, conditions for the identified signals are shown and are based on assumptions such as, for example, that the bit line (BL) and source line (SL) are precharged to 0 or a low level and that the cells are selected as illustrated in FIG. 8.

Access operation—Write data L
    BL Driver=H
    Selected BL Select=H

Unselected BLs Select=L
Selected BL=H
Unselected BLs=pre-charge voltage $V_{THP\_LV}$
SL Driver=L
Selected SL Select=L
Unselected SL Select=H
Selected SL=pre-charge voltage $V_{THP\_LV}$
Unselected SL=Floating
Access operation—Write data H
BL Driver=L
Selected BL Select=H
Unselected BL Select=L
Selected BL=L
Unselected BLs=H
SL Driver=H
Selected SL Select=L
Unselected SL Select=H
Selected SL=H
Unselected SL=Floating It will be appreciated that the H high voltage or logic level and the L low voltage or logic level may be supply or reference voltage levels or may be higher or lower than the supply or reference voltage levels. The term floating F indicates the line was decoupled from the voltage source and is now at a generally high impedance state and may float up or down, but not sufficiently to independently bias the switching elements. It should also be noted that the foregoing listing of signal levels is provided merely for illustration in conjunction with the timing signals illustrated in FIG. 9, which in turn illustrate the bit cells of one of the STT_MRAM arrays discussed herein in connection with, for example, FIG. 8B and FIG. 8C. In accordance with the illustrated signal levels, advantageous reduction in current, reduction in block size, and prevention of invalid write operations for both the "1" level and the "0" level are possible. Circuits and logic for implementing the generation of the levels and the execution of access functions or operations will be described in greater detail below. Accordingly, a detailed description of each signal will not be provided. It should also be noted that different data levels can be written to memory cells in Block 0 and Block 1. For example, in order to write a L data level to a memory cell within Block 0 and a H data level to a memory cell within Block 1, write data L signals and timing of FIG. 9 can be applied to Block 0 and write data H signals and timing of FIG. 9 can be applied to Block 1.

Figure 10A:
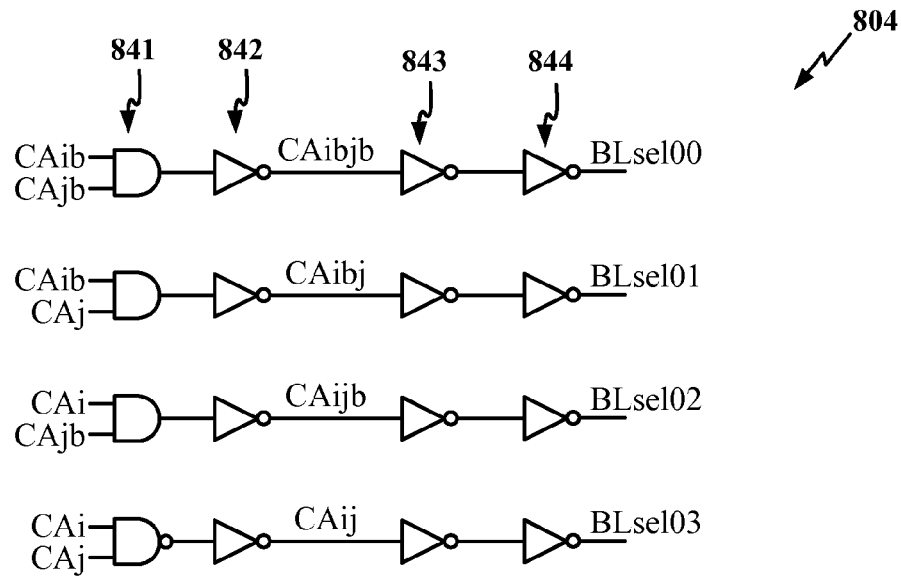
FIG. 10A is diagram illustrating one embodiment of an exemplary bit line selector suitable for the STT-MRAM arrays of FIG. 8E.
Figure 10B:
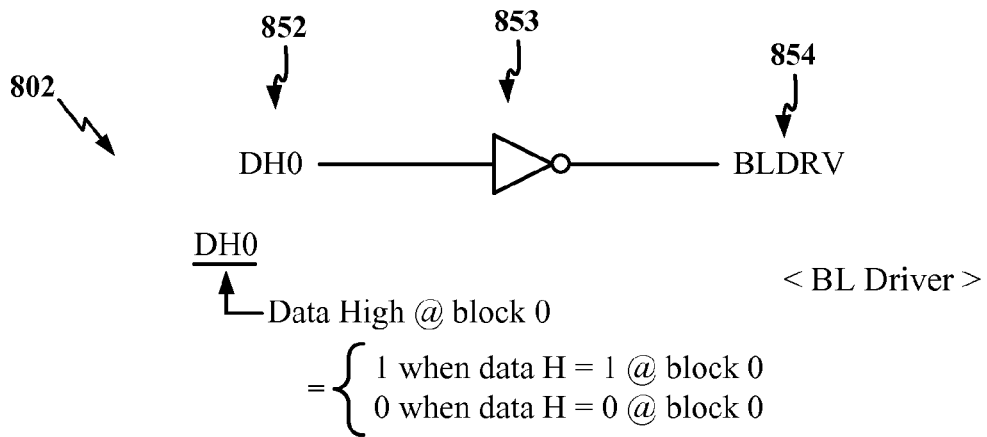
FIG. 10B is a diagram illustrating one embodiment of an exemplary a bit line driver suitable for the STT-MRAM arrays of FIG. 8E.

FIG. 10A illustrates an example of a bit line selector circuit. For example, using column address inputs (CAi and CAj) and their complements (CAib, CAjb), as inputs to NAND gates 841, bit line select signals BLse100-BLse103 can be generated. The respective outputs of NAND gates 841 can be input to corresponding respective inverters 842. In order to generate appropriate current level, additional banks of inverters such as inverters 843 and 844 can be positioned to drive the respective bit line select signals BLse100-BLse103. FIG. 10B illustrates details of an exemplary bit line driver, such as bit line driver 802, with an input 852 of DHO, an inverter 853, and an inverted output 854 BLDRV.

Figure 11A:
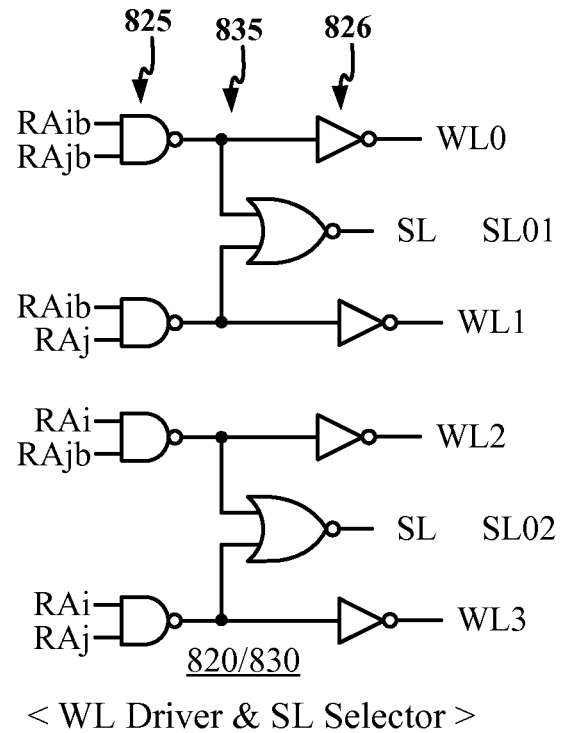
FIG. 11A is a diagram illustrating one embodiment of an exemplary combined word line driver and source line selector suitable for the STT-MRAM arrays of FIG. 8E.

FIG. 11A illustrates an example of a circuit that can be used for word line driver such as driver 820 and also for the source line selector such as selector 830. For example assuming four word lines and two source select lines, as illustrated, NAND gates 825 can receive row address i and j inputs, RAi and Raj, and complements thereof. The outputs of NAND gates 825 are provided to inverters 826 to invert and buffer the signal and drive the respective word line. The outputs of NAND gates 825 are also provided in pairs to NAND gates 835 to select the appropriate source line. Since the source lines are shared between two cells, the source line selector can be configured to be enabled when any of the two adjacent word lines are enabled. However, the foregoing circuit could also be arranged into two or more independent circuits. For example, the row address i and j inputs such as RAi and Raj, could be provided directly to a source select circuit comprising NAND gates 825 and NAND gates 835 and the NAND gates 835 could be removed from the word line driver circuit. Accordingly, embodiments of the invention are not limited to the illustrated configurations contained herein.

Figure 11B:
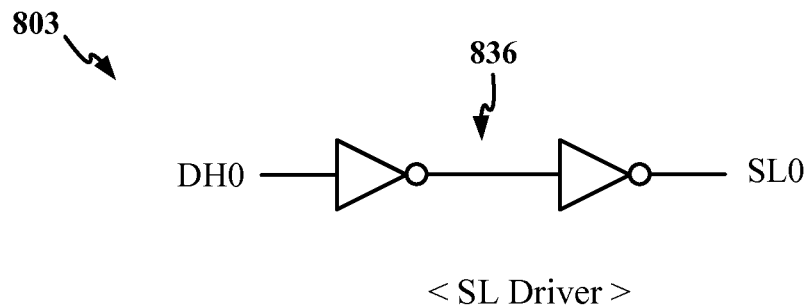
FIG. 11B is a diagram illustrating one embodiment of an exemplary source line driver suitable for the STT-MRAM array of FIG. 8E.

FIG. 11B illustrates an example of a source line driver. The driver can receive signal DH0, which is buffered by inverters 836. Since there are two inverters in series, DH0 is not inverted by the source line driver 803 as illustrated. However, it will be appreciated that this configuration could be replaced by a single non-inverting amplifier or driver. Likewise, any of the foregoing circuits can be modified using components known in the art to achieve a similar functionality. For example, the bit line driver 802, as shown in FIG. 10B can alternatively be configured in a manner similar to the source line driver 803 illustrated in FIG. 11B. Further, the source line driver and the bit line driver can each be adapted to be configured as a multiplexer (MUX) such that the driver and selector logic are configured in the same area of the circuit or cell thus reducing cell size and power requirements. Accordingly, the embodiments illustrated herein are merely for the convenience of providing examples and explanation and are not intended to limit the scope of embodiments of the invention.

Figure 12A:
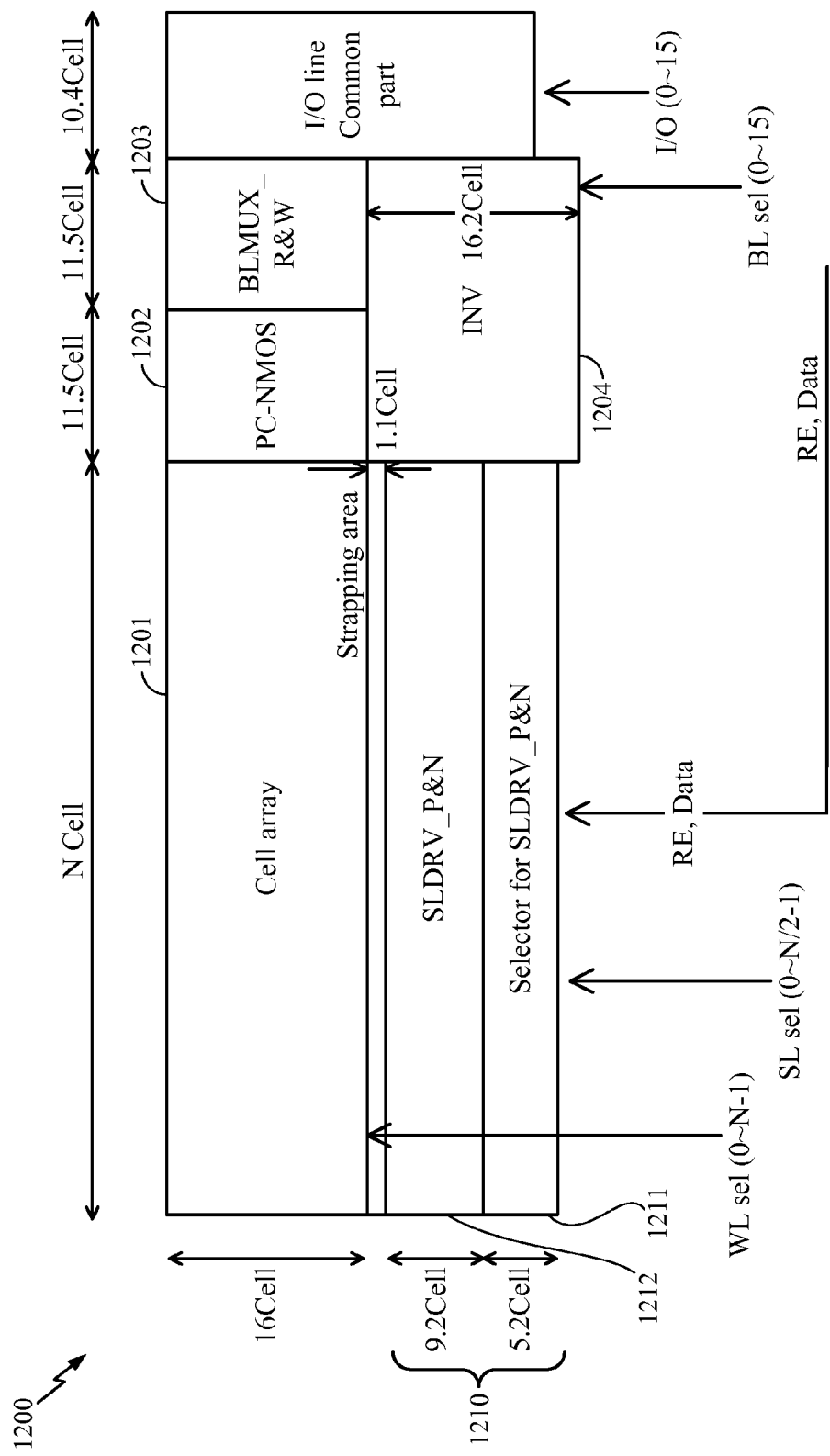
FIG. 12A is a diagram illustrating a block area in accordance with one prior configuration.

It will be appreciated that by using independent line drivers, additional area and power is consumed in an exemplary circuit. A block area layout 1200 for a circuit using, for example, independent source line drivers is shown in FIG. 12A. As can be seen, a cell array 1201 is surrounded within a cell area by a pre-charge area 1202 and a bit line select multiplexer 1203. Driver elements are located in the inverter section 1204. The source line selector section 1210 includes a selector portion 1211 and a source line driver portion 1212. The circuit area is increased due to the increased requirement for NMOS inverters, for example, in inverter section 1204 and a separate source line selector portion 1211 and source line driver portion 1212.

Figure 12B:
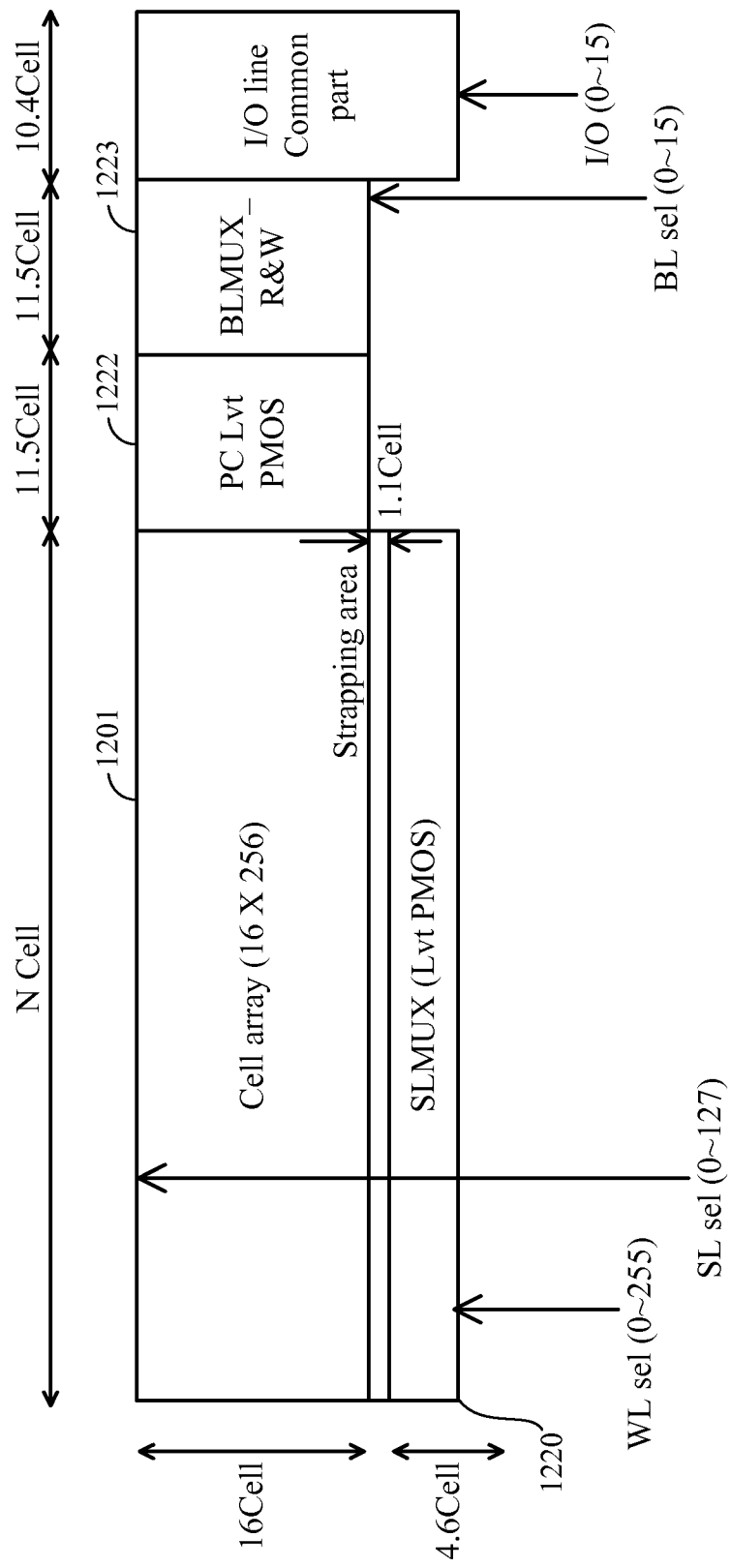
FIG. 12B is a diagram illustrating a comparative reduction in size over FIG. 12A for a block area in accordance with an exemplary bit line driver and source line driver suitable for an STT-MRAM array.

In exemplary embodiments for increasing space efficiency and reducing factors such as current requirements and the like, as discussed and described herein, for example as illustrated in FIG. 12B, the area can be conserved and other advantages can be achieved by devising a multiplexed arrangement. As can be seen, selector section 1210 can be replaced by, for example, a select line multiplexer or selector control unit 1220 where a selector and a common driver can be arranged in multiplexed relation and can include a plurality of low voltage PMOS elements (not shown). Further, bit line multiplexer or bit line control unit 1223 can be configured with a common driver to eliminate the need for the inverter section 1204. Pre-charge unit 1202 can be replaced with a pre-charge unit 1222, which can include a plurality of low voltage PMOS elements (not shown). In addition to a reduction in size achieved as described above, the inclusion of, for example, low voltage PMOS elements (not shown) in the circuits, reduces costs and area still further.

In accordance with other exemplary embodiments, for example as shown in FIG. 13A, a method of making an STT-MRAM can be described as follows. After start at 1301, such as the beginning of the semiconductor fabrication procedure, related design procedures, or the like, a source line or source lines can be formed that are parallel to a word line and perpendicular to a bit line that are formed in the STT-MRAM device at 1302. One source line multiplexer can be formed adjacent to the bit cell array at 1303 and can include a common source line driver and a source line selector for each source line. Another source line multiplexer can also be formed adjacent to the bitcell array at 1303 and can include a PMOS element for each bit line. A bit line multiplexer can also be formed adjacent to the bit cell array at 1304. The bit line multiplexer can include a common bit line driver and a bit line selector for each bit line. It will be appreciated that additional steps can be performed to complete the STT-MRAM device, including steps that can be performed before and after the above noted steps, however details have been omitted for simplicity, after which the exemplary method can end at 1306.

In accordance with still other exemplary embodiments, for example as shown in FIG. 13B, a method of writing to an STT-MRAIVI can be described as follows. After start at 1310, when writing "1", a low level, such as a voltage level, logic level or the like, can be established on a bit line associated with a selected bit cell in 1311 by the turning on of an NMOS element with a L level of bit line driver. A high level, such as a voltage level, logic level or the like can be established on unselected bit lines at 1312 by turning on a PMOS element with a H level of source line driver. The bit line and source line, which are coupled to the bit line and source line common drivers during selection, can provided with proper voltage levels at 1313 using, for example, a NMOS and a PMOS coupled to bit lines and a PMOS element coupled to source line, thus preventing invalid writes on unselected lines that can occur in unprotected circuits due to currents that can feed through from the source line to unselected bit lines. While the process is indicated as ending at 1314 it will be appreciated that the above described procedure can be repeated for every write operation that is performed.

While the procedures shown in FIG. 13A and FIG. 13B are shown with various actions or sub-procedures, embodiments are not limited solely to those described herein. It will be appreciated that the exemplary procedure can be embodied as a series of steps and associated functions as set forth in the claims appended hereto using suitable structures and procedures, for example, as described herein.

The foregoing disclosed devices and methods are conventionally designed and are configured into computer files having PCB layout specifications according to a format such as, GDSII, GERBER and the like. The specification files are stored on a computer readable media. These files are in turn provided to fabrication handlers who fabricate devices based on these files. The resulting products are semiconductor wafers that are then cut into semiconductor die and packaged into a semiconductor chip. The chips are then employed in devices described above.

It will be further appreciated that the STT-MRAM as described herein may be included within a mobile phone, portable computer, hand-held personal communication system (PCS) unit, portable data units such as personal data assistants (PDAs), GPS enabled devices, navigation devices, settop boxes, music players, video players, entertainment units, fixed location data units such as meter reading equipment, or any other device that stores or retrieves data or computer instructions, or any combination thereof. Accordingly, embodiments of the disclosure may be suitably employed in any device which includes active integrated circuitry including the level shifter as disclosed herein such as by being integrated into at least one semiconductor die associated with circuits in such devices.

In view of the foregoing, it will also be appreciated that embodiments of the invention include methods, steps, actions, sequences, algorithms and/or processes to achieve the functionalities discussed herein.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A Spin Transfer Torque Magnetoresistive Random Access Memory (STT-MRAM) comprising:
   a bit cell array having a first source line substantially parallel to a word line coupled to first bit cells, wherein the first source line is substantially perpendicular to bit lines coupled to the first bit cells; and
   a source line control unit coupled to the bit cell array, the source line control unit including a common source line driver coupled to a plurality of source lines including the first source line and a source line selector configured to select individual ones of the plurality of source lines, the source line driver and the source line selector coupled in multiplexed relation.

2. The STT-MRAM of claim 1, further comprising:
   a bit line control unit coupled to the bit cell array and the source line control unit, the bit line control unit including a common bit line driver coupled to a plurality of the bit lines and a bit line selector coupled to the plurality of the bit lines, the common bit line driver and the bit line selector in multiplexed relation.

3. The STT-MRAM of claim 2, wherein the bit line control unit includes a plurality of positive channel metal oxide semiconductor (PMOS) elements.

4. The STT-MRAM of claim 2, wherein the bit line control it includes a positive channel metal oxide semiconductor (PMOS) element coupled between the common source line driver and each of a. plurality of bit line select lines associated with the plurality of bit lines respectively, and each of the plurality of bit lines.

5. The STT-MRAM of claim it, wherein the source line control unit includes a plurality of positive channel metal oxide semiconductor (PMOS) elements.

6. The STT-MRAM of claim 1, wherein the source tine control unit includes a positive channel metal oxide semiconductor (PMOS) element coupled between the common source line driver and each of a plurality of source line select lines associated with the plurality of source lines respectively, and each of the plurality of source lines.

7. The STT-MRAM of claim 1, further comprising:
   an invalid write prevention circuit coupled between the bit line control it and the source line control unit.

8. The STT-MRA.M of claim 7, wherein the invalid write prevention circuit includes a positive channel metal oxide semiconductor (PMOS) element.

9. The STT-MRAM of claim 2, further comprising an invalid write prevention circuit configured to set a voltage associated with unselected ones of the plurality of bit lines equal to a selected one of the plurality of source lines.

10. The STT-MRAM of claim 1, integrated in at least one semiconductor die.

11. The STT-MRAM of claim 1, wherein the STT-MRAM is integrated into an electronic device, selected from the group consisting of a set top box, music player, video player, entertainment unit, navigation device, communications device, personal digital assistant (PDA), fixed location data unit, and a computer.

\* \* \* \* \*

UNITED STATES PATENT AND TRADEMARK OFFICE
CERTIFICATE OF CORRECTION

PATENT NO.         : 8,432,727 B2
APPLICATION NO.    : 12/769995
DATED              : April 30, 2013
INVENTOR(S)        : Ryu et al.

Page 1 of 1

It is certified that error appears in the above-identified patent and that said Letters Patent is hereby corrected as shown below:

Title Page, Item [73], should read as follows:

Industry-Academic Cooperation Foundation, Yonsei University, Seoul, Korea (KR)

Signed and Sealed this
Twenty-fifth Day of March, 2014

Michelle K. Lee
*Deputy Director of the United States Patent and Trademark Office*